(12) United States Patent
Kondo et al.

(10) Patent No.: US 11,863,176 B2
(45) Date of Patent: Jan. 2, 2024

(54) OPERATION PANEL

(71) Applicant: Marelli Corporation, Saitama (JP)

(72) Inventors: Daisuke Kondo, Saitama (JP); Yuuichi Fukumitsu, Saitama (JP); Hideto Ujiie, Saitama (JP)

(73) Assignee: Marelli Corporation, Saitama (JP)

( * ) Notice: Subject to any disclaimer, the term of this patent is extended or adjusted under 35 U.S.C. 154(b) by 75 days.

(21) Appl. No.: 17/619,017

(22) PCT Filed: Jul. 1, 2020

(86) PCT No.: PCT/JP2020/025848
§ 371 (c)(1),
(2) Date: Dec. 14, 2021

(87) PCT Pub. No.: WO2021/053927
PCT Pub. Date: Mar. 25, 2021

(65) Prior Publication Data
US 2022/0352891 A1    Nov. 3, 2022

(30) Foreign Application Priority Data

Sep. 19, 2019 (JP) ................................ 2019-170331

(51) Int. Cl.
*H03K 17/975* (2006.01)
*B60K 37/06* (2006.01)

(52) U.S. Cl.
CPC ........... *H03K 17/975* (2013.01); *B60K 37/06* (2013.01); *B60K 2370/143* (2019.05); *H03K 2217/965* (2013.01)

(58) Field of Classification Search
CPC ... H03K 2217/965; H03K 2217/96015; H03K 2217/96042; H03K 17/975; H01H 13/70;
(Continued)

(56) References Cited

U.S. PATENT DOCUMENTS

2020/0108718 A1* 4/2020 Carvalho ........... H03K 17/9643
2021/0313983 A1   10/2021 Ujiie

FOREIGN PATENT DOCUMENTS

JP    2003-123585 A    4/2003
JP    2009-238518 A    10/2009
(Continued)

*Primary Examiner* — Anthony R Jimenez
(74) *Attorney, Agent, or Firm* — Young Basile Hanlon & MacFarlane, P.C.

(57) ABSTRACT

An operation panel provided on a vehicle is provided with: a panel member exposed to an interior of a vehicle cabin of the vehicle; an operation part provided on the panel member; and a load sensor provided so as to face a back surface of the panel member, the a load sensor being configured to detect that the operation part has been operated based on a load caused by a displacement of the panel member, wherein the load sensor is provided at a position where the displacement of the panel member is greater than a displaced amount of the operation part when the operation part is operated, the panel member has a projected portion projecting out from the back surface such that a tip end portion faces the load sensor, and the projected portion is formed of divided projected portions, the divided projected portions being provided by being divided into a plurality of parts.

5 Claims, 6 Drawing Sheets

(58) Field of Classification Search
CPC ........ H01H 13/72; H01H 13/76; H01H 13/84; H01H 859/00; H01H 9/26; H01H 3/12; H01H 3/48; H01H 1/06; H01H 1/60; H01H 2227/032; H01H 2227/034; H01H 35/00; H01H 35/2614; H01H 35/2621; H01H 35/2628; H01H 35/2685; H01H 2211/032; H01H 1/02; B60K 35/00; B60K 37/00; B60K 37/01; B60K 37/04; B60K 37/06; B60K 2370/00; B60K 2370/10; B60K 2370/12; B60K 2370/128; B60K 2370/139; B60K 2370/143; B60K 2370/1446; B60K 2370/40
See application file for complete search history.

(56) References Cited

FOREIGN PATENT DOCUMENTS

| | | | |
|---|---|---|---|
| JP | 2009-301854 | A | 12/2009 |
| JP | 6563095 | B1 | 8/2019 |

* cited by examiner

OPERATION PANEL

TECHNICAL FIELD

The present invention relates to an operation panel.

BACKGROUND ART

JP6563095B discloses a vehicle interior part in which an operation of a switch provided on a finisher is detected by using a touch position sensor and a load sensor. In this vehicle interior part, the touch position sensor detects that a finger of a user has touched the switch and the load sensor detects that the user has operated the switch.

SUMMARY OF INVENTION

However, in the vehicle interior part described in JP6563095B, although an example in which two load sensors are provided is shown, how the load sensors are arranged is not considered specifically.

An object of the present invention is to improve a detection accuracy of a load sensor for an operation of a switch by a user.

According to an aspect of the present invention, an operation panel provided on a vehicle is provided with: a panel member formed to have at least a curved part, the panel member being exposed to an interior of a vehicle cabin of the vehicle; an operation part provided on the panel member, the operation part being configured to be pressed and operated by a user; and a load sensor provided so as to face a back surface of the panel member, the load sensor being configured to detect that the operation part has been operated based on a load caused by a displacement of the panel member; wherein the load sensor is provided at a position where the displacement of the panel member is greater than a displaced amount of the operation part when the operation part is operated, the panel member has a projected portion projecting out from the back surface such that a tip end portion faces the load sensor, and the projected portion is formed of divided projected portions, the divided projected portions being provided by being divided into a plurality of parts.

In the above-described aspect, the load sensor is provided at a position where, when the operation part is operated, the displacement of the panel member is greater than the displaced amount of the operation part. Thus, the load sensor detects the load that is larger than the load acting on the operation part by the operation performed by the user. Therefore, it is possible to improve a detection accuracy of the load sensor for the operation of the operation part by the user.

DESCRIPTION OF EMBODIMENTS

In the following, an operation panel 2 according to an embodiment of the present invention and an instrument panel 1 serving as a vehicle interior part to which the operation panel 2 is applied will be described with reference to the drawings.

Figure 1:
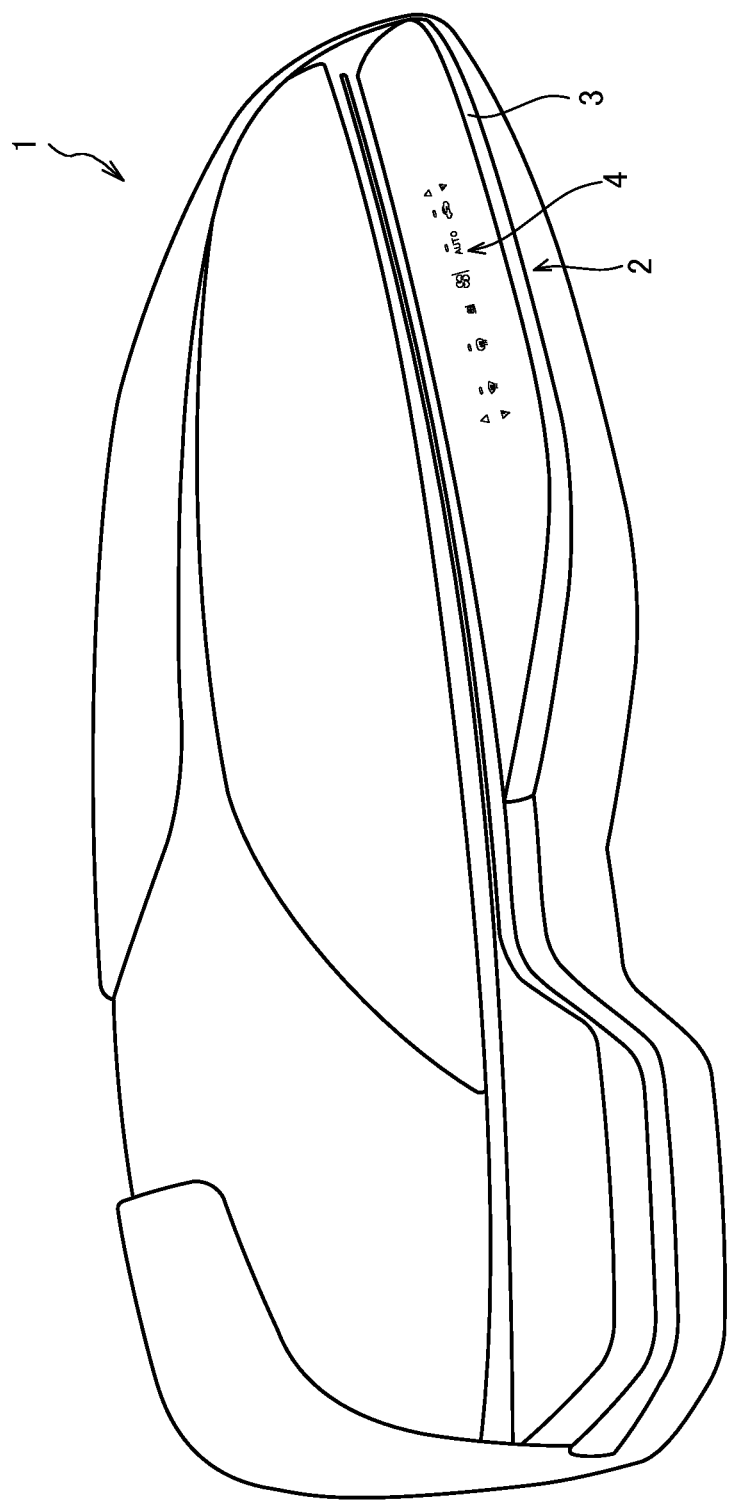
FIG. 1 is a perspective view showing a configuration of a vehicle interior part to which an operation panel according to an embodiment of the present invention is applied.

The instrument panel 1 will be described with reference to FIG. 1. FIG. 1 is a perspective view showing a configuration of the instrument panel 1.

As shown in FIG. 1, the instrument panel 1 has the operation panel 2. The instrument panel 1 is provided inside a vehicle cabin of a vehicle. The instrument panel 1 is provided at a front part in the vehicle cabin including the front side of a driver's seat. Meters (not shown) indicating information of an automobile are arranged in the instrument panel 1.

Next, the operation panel 2 will be described with reference to FIGS. 2 to 6.

Figure 2:
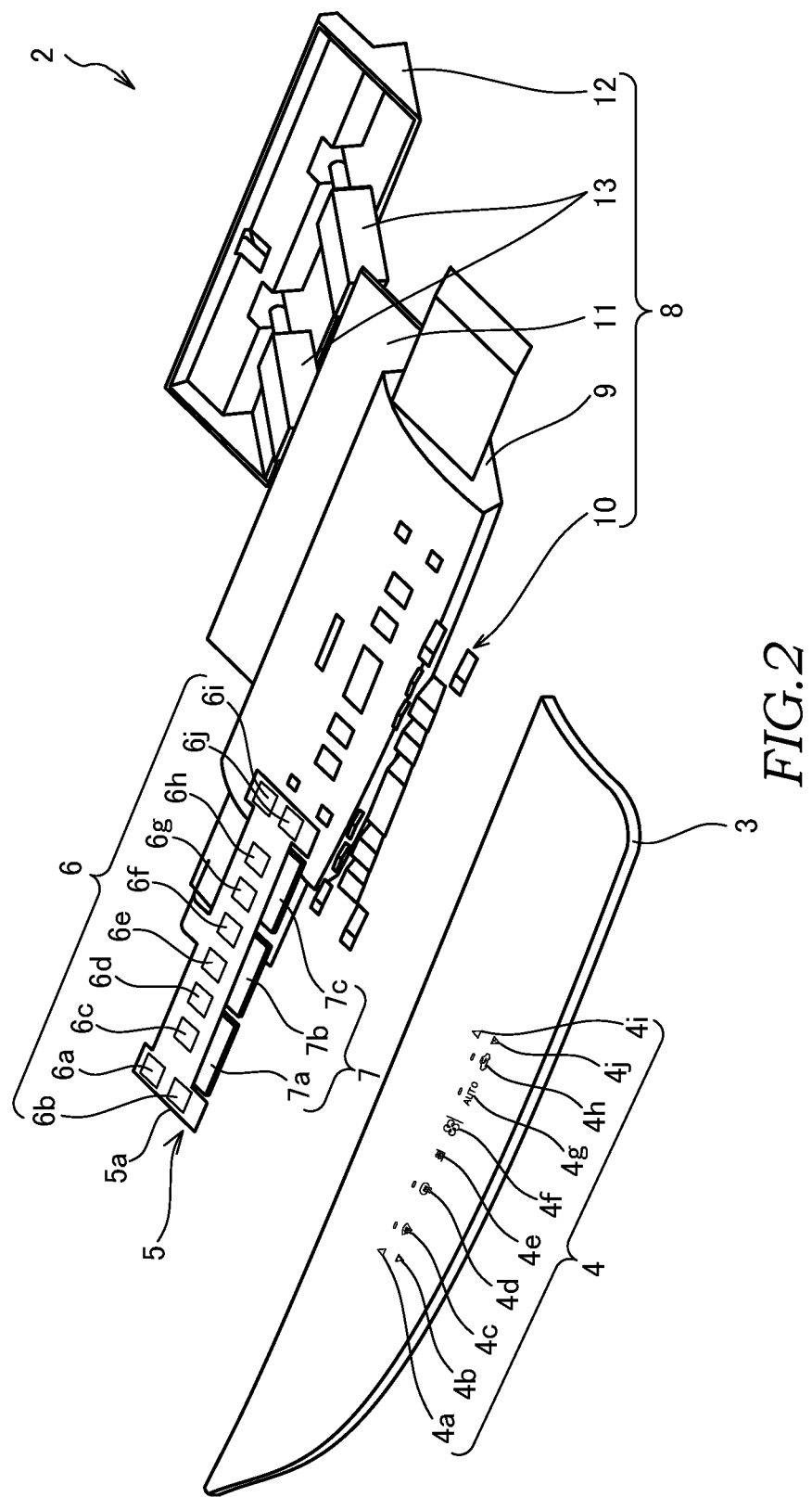
FIG. 2 is an exploded perspective view of the operation panel.
Figure 3:
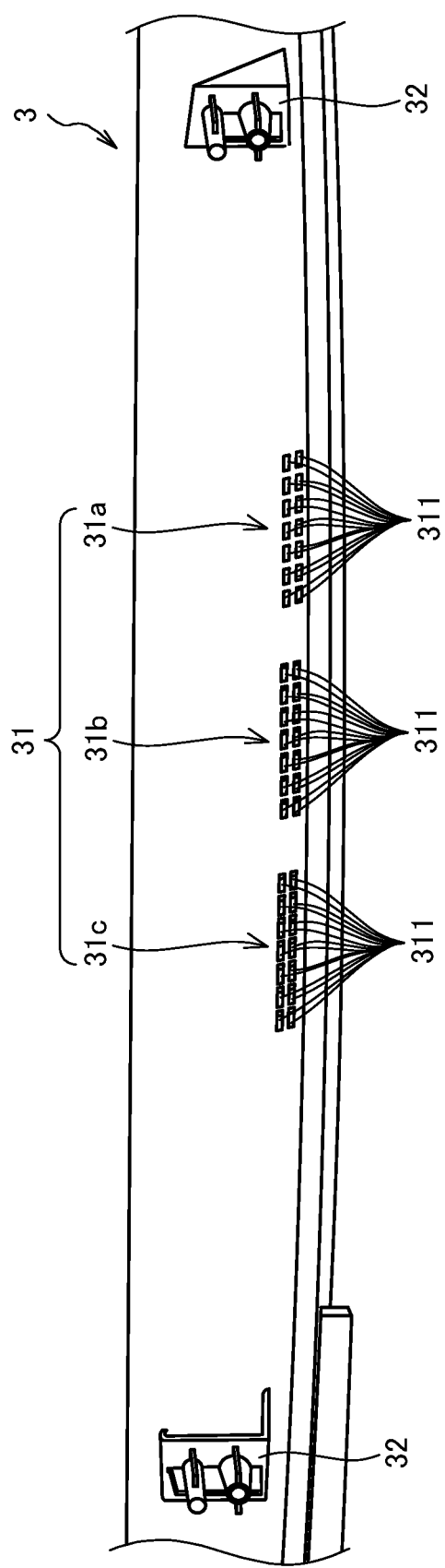
FIG. 3 is a perspective view of a panel member viewed from the back surface side.
Figure 4:
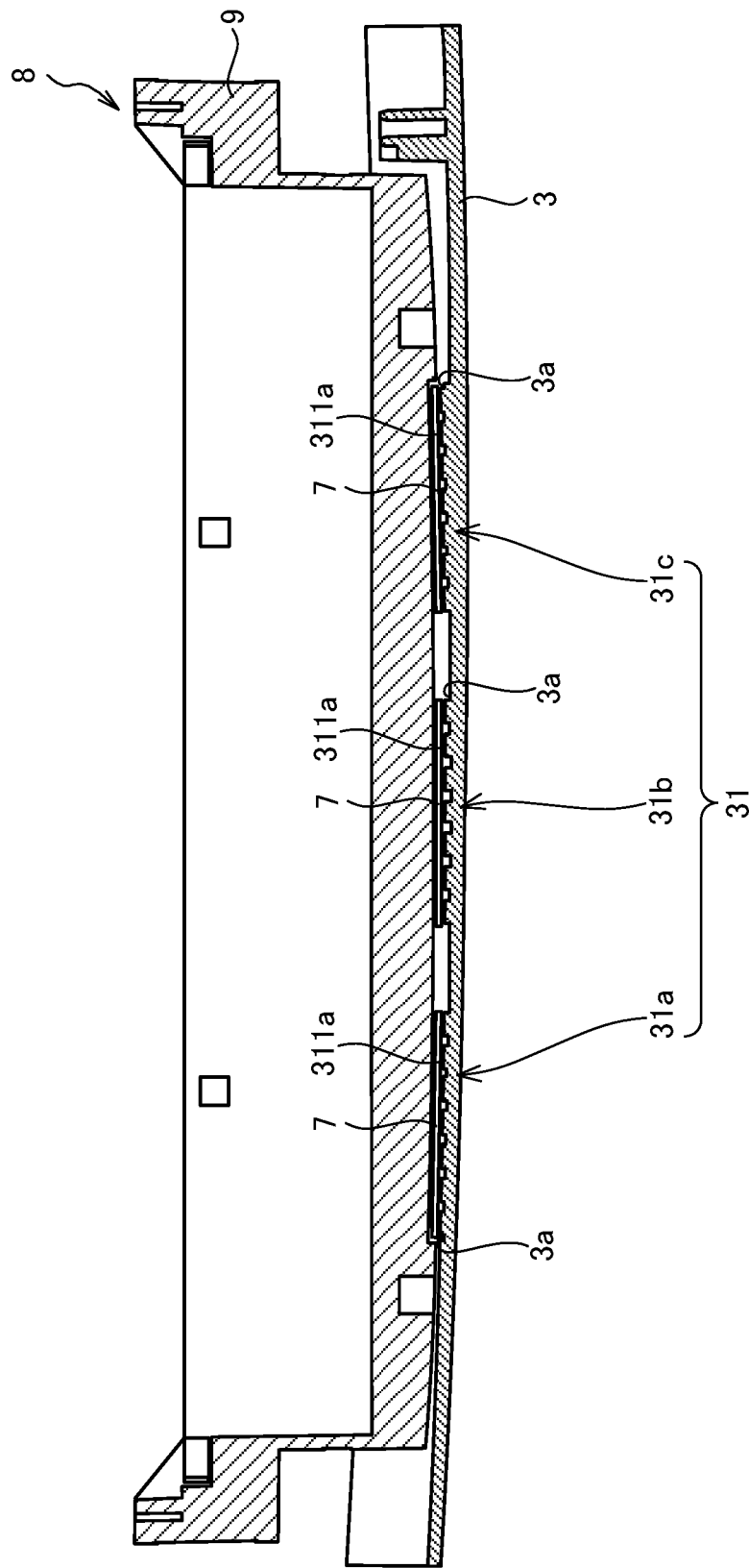
FIG. 4 is a sectional view of the panel member and a main body portion at a position where a projected portion is provided.
Figure 5:
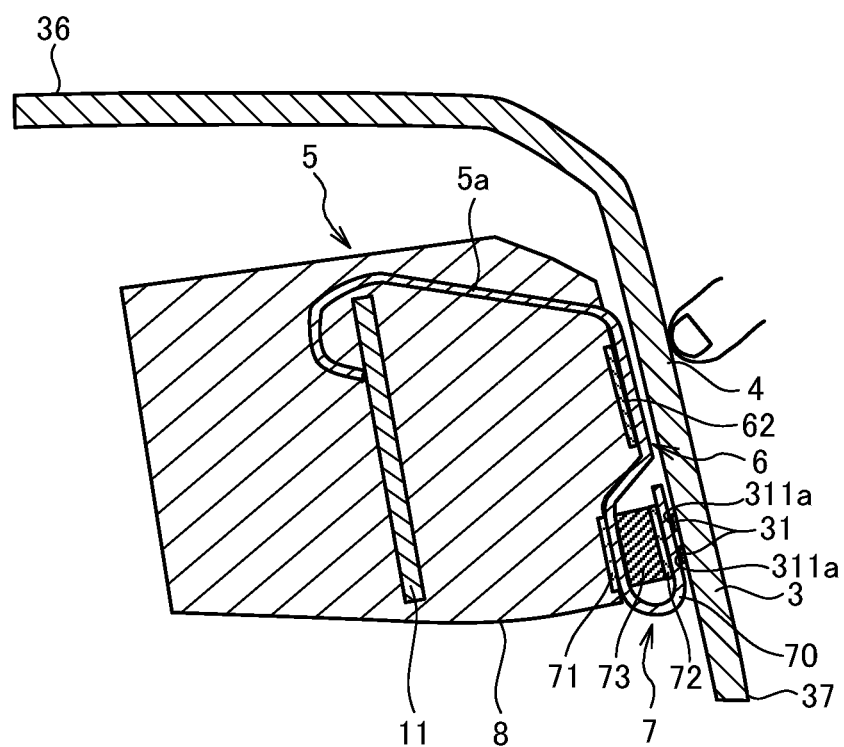
FIG. 5 is a sectional view for explaining configurations of a touch position sensor and a load sensor.
Figure 6:
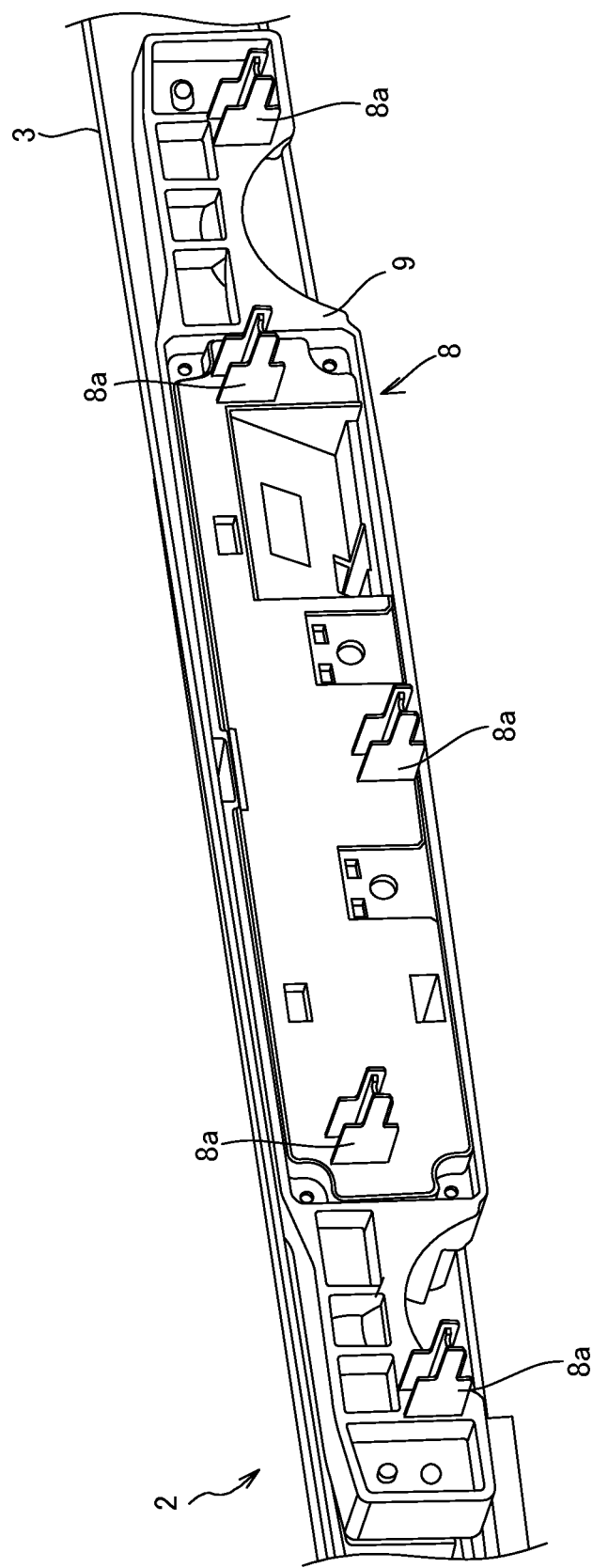
FIG. 6 is a perspective view of the operation panel viewed from the back surface side.

FIG. 2 is an exploded perspective view of the operation panel 2. FIG. 3 is a perspective view of a panel member 3 viewed from the back surface side. FIG. 4 is a sectional view of a part of the panel member 3 and a main body portion 8 where projected portions 31 are provided. FIG. 5 is a sectional view for explaining configurations of touch position sensors 6 and a load sensor 7. FIG. 6 is a perspective view of the operation panel 2 viewed from the back surface side.

As shown in FIG. 2, the operation panel 2 is provided with the panel member 3, a sensor module 5, and the main body portion 8.

The panel member 3 is formed to have a free-form surface shape having at least a curved part. The panel member 3 is exposed to an interior of the vehicle cabin of the vehicle. The panel member 3 has switches 4 each serving as an operation part.

The switches 4 are provided as parts of the panel member 3. The switches 4 are pressed and operated by a user. The switches 4 have a first switch 4a to a tenth switch 4j for operating an air-conditioning device (an air conditioner).

The first switch 4a, a second switch 4b, a ninth switch 4i, and the tenth switch 4j are switches for adjusting a temperature setting of the air-conditioning device. A third switch 4c is a switch for switching ON/OFF of a rear defogger. A fourth switch 4d is a switch for switching ON/OFF of a front defroster. A fifth switch 4e and a sixth switch 4f are switches for adjusting an wind level of the air-conditioning device. A seventh switch 4g is a switch for switching ON/OFF of an AUTO mode. An eighth switch 4h is a switch for switching an external air/internal air circulation.

As shown in FIG. 3, the panel member 3 has the projected portions 31 and attachment parts 32.

The projected portions 31 project out from a back surface of the panel member 3. The projected portions 31 are each formed of divided projected portions 311 that are provided by being divided into a plurality of parts. With such a configuration, because each of the divided projected portions 311 can be formed to have a small size, when the panel member 3 is formed by an injection molding of a resin material, it is possible to suppress formation of a sink mark on a surface of the panel member 3 compared with a case in which a large projected portion is formed on the back surface.

As shown in FIG. 4, each of the projected portions 31 is formed in a flat surface portion 3a of the panel member 3. In other words, even if the surface of the panel member 3 has the curved shape, the flat surface portion 3a is formed in the back surface on which the projected portions 31 are formed. With such a configuration, it is possible to equalize the projected heights of respective divided projected portions 311 in each of the projected portions 31.

The projected portions 31 have a first projected portion 31a, a second projected portion 31b, and a third projected portion 31c. The first projected portion 31a faces a first load sensor 7a, which will be described below. The second projected portion 31b faces a second load sensor 7b, which will be described below. The third projected portion 31c faces a third load sensor 7c, which will be described below. The projected height of the second projected portion 31b is higher than the projected height of the first projected portion 31a. The projected height of the third projected portion 31c is higher than the projected height of the second projected portion 31b. The projected heights of the first to third projected portions 31a to 31c are set in accordance with the shape of the panel member 3.

As shown in FIG. 5, tip end portions 311a of the projected portions 31 face the load sensor 7. The divided projected portions 311 are each formed to have the projected height such that the distance between the panel member 3 and the load sensor 7 becomes uniform. In other words, even if the surface of the panel member 3 has the curved shape, the tip end portions 311a of the divided projected portions 311 coming into contact with the load sensor 7 are arranged on a flat plane that extends in parallel with a surface of the load sensor 7. With such a configuration, it is possible to cause all of the divided projected portions 311 to come into contact with the load sensor 7, rather than causing only a part of the divided projected portions 311 to come into contact with the load sensor 7.

As shown in FIG. 3, the attachment parts 32 are provided at positions away from the projected portions 31 in the longitudinal direction. With such a configuration, deformation of the panel member 3 is not interfered when the switches 4 are operated by the user.

As shown in FIG. 2, the sensor module 5 has a sensor sheet 5a, the touch position sensors 6, and the load sensor 7.

The sensor sheet 5a is connected to a substrate part 11. The sensor sheet 5a electrically connects the touch position sensors 6 and the load sensor 7 with the substrate part 11.

The touch position sensors 6 are provided on the sensor sheet 5a so as to face the back surface of the panel member 3. The touch position sensors 6 are respectively provided so as to correspond to the switches 4. The touch position sensors 6 detect that a finger of the user has touched each of the switches 4. In other words, the first to tenth touch position sensors 6a to 6j are respectively provided at the positions corresponding to the first to tenth switches 4a to 4j.

As shown in FIG. 5, the touch position sensors 6 are provided on the back surface of the panel member 3 so as to respectively correspond to the switches 4. The touch position sensors 6 are each a capacitive proximity sensor. The touch position sensors 6 each has a plate-shaped electrode 62 that is arranged on the sensor sheet 5a.

The touch position sensors 6 measure an electrostatic capacity value at a period of 10 [ms], for example. As the finger of the user touches the switch 4, the electrostatic capacity value to be measured by the touch position sensor 6 is changed. In accordance with this change in the electrostatic capacity value, the touch position sensor 6 detects which of the switches 4 has been touched by the finger of the user.

As shown in FIG. 2, the load sensor 7 is provided on the sensor sheet 5a so as to face the back surface of the panel member 3. The load sensor 7 detects a load caused when the panel member 3 is displaced as the switch 4 is operated. In other words, the load sensor 7 detects the load applied by the user to each of the switches 4. On the basis of the detected load, the load sensor 7 detects that the switch 4 has been operated. The load sensor 7 is provided with the first load sensor 7a, the second load sensor 7b, and the third load sensor 7c.

The first load sensor 7a is provided between the third switch 4c and the fourth switch 4d under the third switch 4c and the fourth switch 4d. The second load sensor 7b is provided between the fifth switch 4e and the sixth switch 4f under the fifth switch 4e and the sixth switch 4f. The third load sensor 7c is provided between the seventh switch 4g and the eighth switch 4h under the seventh switch 4g and the eighth switch 4h.

As shown in FIG. 5, the load sensor 7 has a plate-shaped first electrode 71, a plate-shaped second electrode 72, and a spacer 73.

The first electrode 71 is provided on the sensor sheet 5a so as to face the main body portion 8. The second electrode 72 is provided on the sensor sheet 5a so as to face the back surface of the panel member 3. The spacer 73 is provided between the panel member 3 and the sensor sheet 5a and is arranged such that the first electrode 71 and the second electrode 72 respectively face with the spacer 73 with a predetermined gap therebetween. The spacer 73 is provided so as to be elastically deformable and is compressed and deformed when the switch 4 is operated by the user.

The load sensor 7 is a capacitive position sensor that is wrapped with a projected piece 70 serving as a ground part by folding the projected piece 70 that is formed on an end portion of the sensor sheet 5a holding the first electrode 71 and the second electrode 72 each serving as an electrode. With such a configuration, because a portion where the projected piece 70 is folded becomes a closed state, it is possible to prevent a leakage of electric charge. Therefore, it is possible to suppress a misdetection by the load sensor 7.

The load sensor 7 measures the electrostatic capacity value at a period of 10 [ms], for example. As the user presses the switch 4 down by the finger, the panel member 3 is deformed so as to be dented about the position of the switch 4. As the panel member 3 is dented, the distance between the first electrode 71 and the second electrode 72 is decreased. Therefore, the electrostatic capacity value between the first electrode 71 and the second electrode 72 is changed. On the basis of this change in the electrostatic capacity value, the load sensor 7 detects the level of the load (load detection level) acting on the panel member 3.

As shown in FIG. 5, an upper end portion 36 of the panel member 3 is a fixed end that is attached to the vehicle body, and a lower end portion 37 thereof is a free end that is not attached to other member. The load sensor 7 is provided at the position closer to the lower end portion 37 than to the switches 4. In other words, the load sensor 7 is provided at the position where, when the switch 4 is operated, the displacement of the panel member 3 is greater than the displaced amount of the switch 4.

With such a configuration, the load sensor 7 can detect the load that is larger than the load acting on the switch 4 by the operation performed by the user. Therefore, it is possible to improve the detection accuracy of the load sensor 7 for the operation of the switches 4 by the user.

As shown in FIG. 2, the main body portion 8 has a base portion 9, illumination parts 10, a the substrate part 11, a case part 12, and a pair of electric solenoids 13 each serving as a vibration generating device.

The base portion 9 is attached to the vehicle body. A plurality of through holes for embedding the illumination parts 10 are formed in the base portion 9.

The illumination parts 10 are each a transparent member that allows the light to pass therethrough. A plurality of illumination parts 10 are provided so as to respectively correspond to the first to tenth switches 4a to 4j. The illumination parts 10 allows the light emitted to the first to tenth switches 4a to 4j from the back surface side to pass therethrough.

The substrate part 11 is provided between the base portion 9 and the case part 12. Electric signals from the touch position sensors 6 and the load sensor 7 are input to the substrate part 11. The substrate part 11 outputs an electric signal to a controller (not shown) of the vehicle in a manner corresponding to the input electric signal. A plurality of light emitting parts (not shown) for respectively illuminating the illumination parts 10 are installed on the substrate part 11. The light emitting parts are each formed of, for example, an LED (Light Emitting Diode).

The case part 12 is inserted on the back side of the base portion 9 and attached to the vehicle body. The case part 12 holds one ends of the electric solenoids 13.

As shown in FIG. 6, the main body portion 8 has a plurality of attachment parts 8a to be attached to the vehicle body. With such a configuration, the main body portion 8 is attached to the vehicle body and the rigidity is ensured. In contrast, the panel member 3 is attached to the vehicle body at the position away from the main body portion 8 in the longitudinal direction. Thus, when the switch 4 is operated by being pressed by the user, the panel member 3 is deformed with respect to the main body portion 8 whose rigidity is ensured by being attached to the vehicle body. Therefore, the pressing pressure is allowed to act on the load sensor 7 when the user operates the switch 4 by pressing it, and so, escape of the pressing pressure to other parts such as the vehicle body, for example, is suppressed.

As shown in FIG. 2, the electric solenoids 13 are arranged on the back surface side of the panel member 3. The electric solenoids 13 generate a touching feeling for the finger of the user by causing vibration to the panel member 3 when the switches 4 are operated. The electric solenoids 13 each has a coil (not shown) and a moving core (not shown).

In the electric solenoids 13, as the coil is energized, the moving core is displaced towards the panel member 3. On the other hand, in the electric solenoids 13, as the coil is de-energized, the moving core is moved away from the panel member 3. With such a configuration, the vibration is generated to the panel member 3 by the electric solenoids 13.

The one ends of the electric solenoids 13 are held by the case part 12. Thus, it is possible to transmit the vibration generated by the displacement of the moving core to the panel member 3 with reliability.

According to the embodiment mentioned above, the advantages described below are afforded.

The operation panel 2 provided on the vehicle is provided with: the panel member 3 formed to have at least a curved part, the panel member 3 being exposed to the interior of the vehicle cabin of the vehicle; the switch 4 provided on the panel member 3, the switch 4 being configured to be pressed and operated by the user; and the load sensor 7 provided so as to face the back surface of the panel member 3, the load sensor 7 being configured to detect that the switch 4 has been operated based on the load caused by the displacement of the panel member 3, wherein the load sensor 7 is provided at the position where the displacement of the panel member 3 is greater than the displaced amount of the switch 4 when the switch 4 is operated.

With this configuration, the load sensor 7 is provided at the position where, when the switch 4 is operated, the displacement of the panel member 3 is greater than the displaced amount of the switch 4. Thus, the load sensor 7 detects the load that is larger than the load acting on the switch 4 by the operation performed by the user. Therefore, it is possible to improve the detection accuracy of the load sensor 7 for the operation of the switches 4 by the user.

In addition, the panel member 3 has the projected portions 31 projecting out from the back surface such that the tip end portions 311a face the load sensor 7.

According to this configuration, because the projected portions 31 are formed to project out such that the tip end portions 311a face the load sensor 7, even if the panel member 3 has the curved shape, it is possible to transmit the load caused when the switch 4 is pressed and operated by the user to the load sensor 7.

In addition, the projected portions 31 are each formed of the divided projected portions 311 that are provided by being divided into a plurality of parts.

According to this configuration, with such a configuration, because each of the divided projected portions 311 can be formed to have a small size, when the panel member 3 is formed by the injection molding of the resin material, it is possible to suppress the formation of the sink mark on the surface of the panel member 3 compared with a case in which a large projected portion is formed on the back surface.

In addition, the divided projected portions 311 are each formed to have the projected height such that the distance between the panel member 3 and the load sensor 7 becomes uniform.

According to this configuration, even if the surface of the panel member 3 has the curved shape, the tip end portions 311a of the divided projected portions 311 coming into contact with the load sensor 7 are arranged on the flat plane that extends in parallel with the surface of the load sensor 7. With such a configuration, it is possible to cause all of the divided projected portions 311 to come into contact with the load sensor 7, rather than causing only a part of the divided projected portions 311 to come into contact with the load sensor 7.

In addition, the projected portions 31 are formed in the flat surface portion 3a of the panel member.

According to this configuration, even if the surface of the panel member 3 has the curved shape, the flat surface portion 3a is formed in the back surface on which the projected portions 31 are formed, and therefore, it is possible to equalize the projected heights of the respective divided projected portions 311 in each of the projected portions 31.

The load sensor 7 is a capacitive sensor that is wrapped with the projected piece 70 serving as the ground part by folding the projected piece 70 that is formed on an end portion of the sensor sheet 5a holding the first electrode 71 and the second electrode 72.

According to this configuration, because a portion where the projected piece 70 is folded becomes the closed state, it is possible to prevent a leakage of electric charge. Therefore, it is possible to suppress a misdetection by the load sensor 7.

Although the embodiment of the present invention has been described in the above, the above-mentioned embodiment merely illustrates a part of application examples of the present invention, and the technical scope of the present invention is not intended to be limited to the specific configurations of the above-described embodiment.

For example, in the above-mentioned embodiment, an example in which the load sensor 7 is of a capacitive type is illustrated. However, as the load sensor 7, a load sensor of other types such as a resistive type, a diffusive type, a film type, and so forth may0 be used.

In addition, in the above-mentioned embodiment, an example in which the switches 4 are used as switches for operating the air-conditioning device has been shown. However, the switches 4 may be switches for operating a car audio system or switches for other operations.

In addition, in the above-mentioned embodiment, an example in which three load sensors 7 are provided has been shown. However, one, two, or four or more load sensors 7 may be employed.

In the above-mentioned embodiment, an example in which ten switches 4 are provided has been shown. However, the number of the switches 4 is not limited to this aspect.

In the above-mentioned embodiment, an example in which the present invention is applied to the operation panel 2 provided on the instrument panel 1 has been shown. However, the present invention may also be applied to input devices that are provided on a console or an armrest. In addition, the present invention may also be applied to input devices provided in a furniture, an electrical appliance, or the like.

The present application claims a priority based on Japanese Patent Application No. 2019-170331 filed with the Japan Patent Office on Sep. 19, 2019, the entire content of which are incorporated into this specification by reference.

The invention claimed is:

1. An operation panel provided on a vehicle, the operation panel comprising:
   a panel member formed to have at least a curved part, the panel member being exposed to an interior of a vehicle cabin of the vehicle;
   an operation part provided on the panel member, the operation part being configured to be pressed and operated by a user; and
   a load sensor provided so as to face a back surface of the panel member, the load sensor being configured to detect that the operation part has been operated based on a load caused by a displacement of the panel member,
   wherein the load sensor is provided at a position where the displacement of the panel member is greater than a displaced amount of the operation part when the operation part is operated,
   wherein the panel member has a projected portion projecting out from the back surface such that a tip end portion faces the load sensor, and
   wherein the projected portion is formed of divided projected portions.

2. The operation panel according to claim 1, wherein the divided projected portions are respectively formed so as to have projected heights such that a distance between the panel member and the load sensor becomes uniform.

3. The operation panel according to claim 1, wherein the projected portion is formed in a flat surface portion of the panel member.

4. The operation panel according to claim 1, wherein the load sensor is a capacitive sensor wrapped with a projected piece by folding the projected piece, the projected piece serving as a ground part being formed on an end portion of a sensor sheet for holding an electrode.

5. The operation panel according to claim 2, wherein the projected portion is formed in a flat surface portion of the panel member.

\* \* \* \* \*